US012278290B2

(12) United States Patent
Chuang (10) Patent No.: US 12,278,290 B2
(45) Date of Patent: Apr. 15, 2025

(54) LOW RESISTIVE SOURCE/BACKGATE finFET

(71) Applicant: Texas Instruments Incorporated, Dallas, TX (US)

(72) Inventor: Ming-Yeh Chuang, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 600 days.

(21) Appl. No.: 17/483,214

(22) Filed: Sep. 23, 2021

(65) Prior Publication Data

US 2023/0091260 A1    Mar. 23, 2023

(51) Int. Cl.
*H01L 29/78*     (2006.01)
*H01L 29/423*    (2006.01)
*H01L 29/66*     (2006.01)

(52) U.S. Cl.
CPC .... *H01L 29/7855* (2013.01); *H01L 29/42356* (2013.01); *H01L 29/66681* (2013.01); *H01L 29/66795* (2013.01); *H01L 29/7816* (2013.01)

(58) Field of Classification Search
CPC .......... H01L 29/7855; H01L 29/42356; H01L 29/66681; H01L 29/66795; H01L 29/7816; H01L 29/66803; H01L 29/785; H01L 21/26586
See application file for complete search history.

(56) References Cited

U.S. PATENT DOCUMENTS

2010/0252816 A1*  10/2010  Ko ..................... H01L 29/1054
                                                          257/E29.264
2014/0183629 A1*   7/2014  Meiser ................ H01L 29/7816
                                                          438/286

OTHER PUBLICATIONS

Chuang, Ming-Yeh, Fin Field Effect Transistor with Field Plating, U.S. Appl. No. 16/920,903, filed Jul. 6, 2020.

* cited by examiner

*Primary Examiner* — Mohammed R Alam
(74) *Attorney, Agent, or Firm* — Yudong Kim; Frank D. Cimino (57) ABSTRACT

An integrated circuit including a substrate with a fin extending from a surface of the substrate. The fin includes a source region, a drain region, and a body region. The source region includes an outer region having a first conductivity type complementary to a second conductivity type of an outer region of the body and an interior-positioned conductive region having the second conductivity type.

36 Claims, 9 Drawing Sheets

LOW RESISTIVE SOURCE/BACKGATE finFET

CROSS-REFERENCE TO RELATED APPLICATION

Not applicable.

BACKGROUND

The example embodiments relate to semiconductor fabrication and devices, for example with respect to a fin field effect transistor (finFET).

Transistors are typically used as a switch or an amplifier, and are critical components, in an integrated circuit (IC). As IC technology has advanced, the number of transistors in an IC has increased, while to reduce the IC size, transistor size has been reduced. A standard metal oxide semiconductor field effect transistor (MOSFETs) is typically measured by its gate width, which also relates to the distance between its source and drain. Accordingly, as MOSFET size has been reduced, the source-to-drain distance likewise is reduced, which increases the chance of current leakage between the source and drain. Some leakage makes the MOSFET less efficient, and too much leakage makes a MOSFET unusable for an application.

A finFET has evolved as an alternative for such reduced device size transistor applications. A finFET is so named as its source or drain structure, or both, has a fin-like shape, typically extending away from a substrate, and the finFET gate wraps around the fitFET typically in non-linear directions. When considered in this this manner, the finFET gate can be considered three-dimensional to the extent it has one portion above its body and one (or more portions) along a respective side of the body, as compared to a MOSFET gate that is solely above the transistor body (channel). Accordingly, the gate-induced channel likewise includes a non-linear path that can extend away from the substrate. This non-linear channel configuration is in contrast with a more traditional FET, which typically is formed as a planar device with a channel parallel to the FET substrate (e.g., within it when the source/drain regions are below the substrate, or above it for a silicon-on-insulator (SOI) transistor). The finFET geometry accordingly affords increased computational power for a smaller transistor channel, so it may accommodate reduced scaling while still providing reduced leakage, faster switching times, and higher current density, as compared to MOSFETs.

A finFET also may be constructed in combination with LDMOS technology, in which the source/drain path is asymmetric relative to the gate as the gate is located closer to the source than the drain, and also typically the drain is electrically separated from the transistor body (and hence also the source) by a drift region. The asymmetry and separation provide a relatively shorter channel width from the source to the channel beneath the gate, while the drift provides a higher breakdown voltage. The construction also may use the substrate p-well as a backgate (BG) connection.

While the finFET provides certain benefits, it also may introduce certain drawbacks. For example, in an LDMOS finFET, the resistance may be relatively high, resulting in a smaller safe operating area (SOA). Additionally, where the source and BG contacts are located only at the top of the structure, such a structure may cause ineffective channel conduction and increase leakage current.

Accordingly, example embodiments that may improve on certain of the above concepts, as detailed below.

SUMMARY

An integrated circuit is described, comprising a substrate with a fin extending from a surface of the substrate. The fin includes a source region, a drain region, and a body region. The source region includes an outer region having a first conductivity type complementary to a second conductivity type of an outer region of the body region and an interior-positioned conductive region having the second conductivity type.

Other aspects are also described and claimed.

BRIEF DESCRIPTION OF THE DRAWINGS

3B illustrates a doping concentration plot representing a portion of the total doping profile in the FIG. 3A cross-section.

DETAILED DESCRIPTION

Figure 1A:
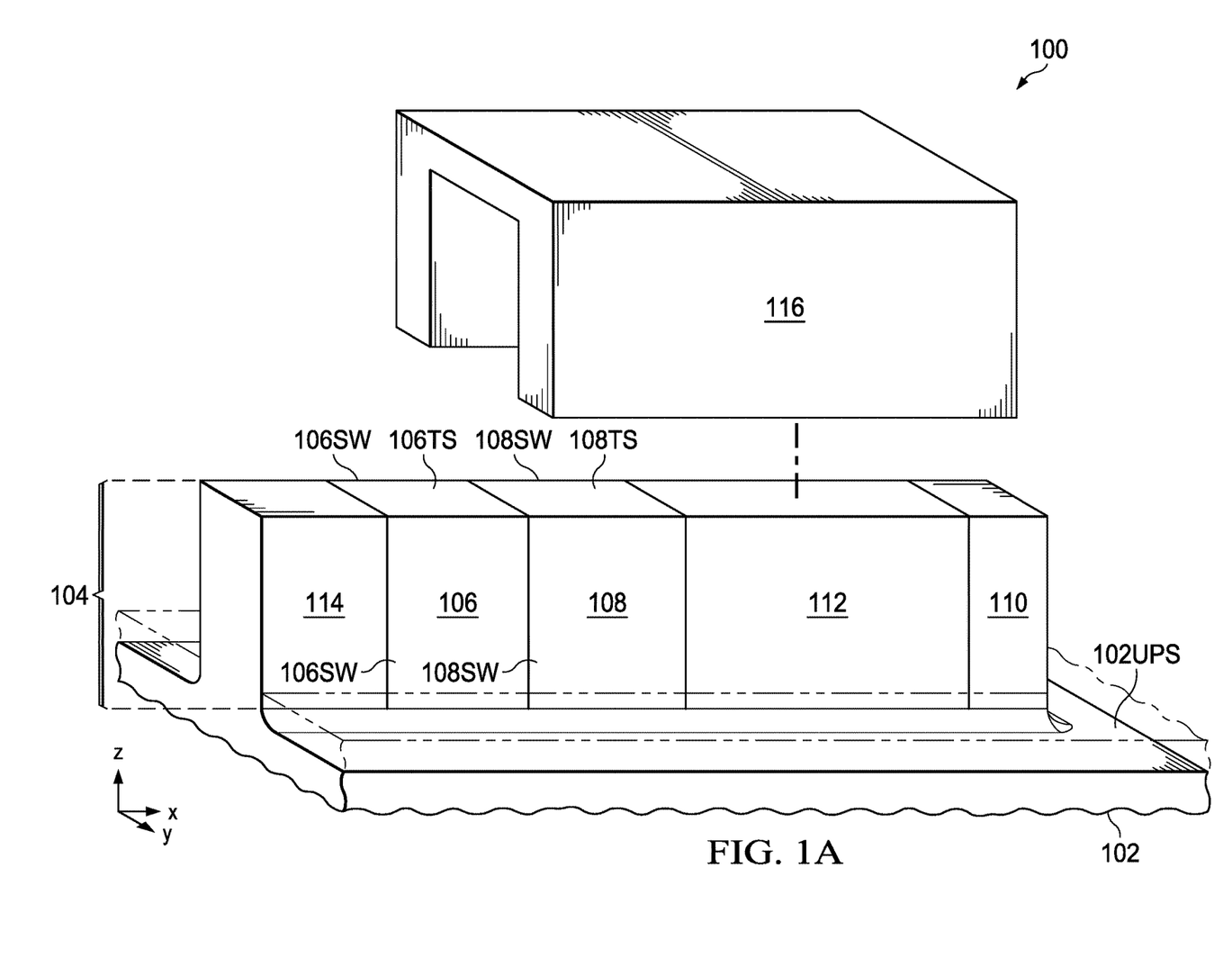
FIG. 1A is a perspective and partially exploded view of an example embodiment finFET.

FIG. 1A is a perspective and partially exploded view of an example embodiment finFET 100. The finFET 100 is formed in connection with a semiconductor substrate 102, which may be bulk silicon, silicon on insulator (SOI), silicon-germanium, gallium arsenide, or the like. In the illustrated example, a semiconductor layer 104 protrudes away from an upper planar surface 102UPS of the substrate 102. The semiconductor layer 104, from its protruding nature, is sometimes referred to as a fin, also thereby giving rise to the terminology of finFET. The semiconductor layer 104 may have varying dimensions, for example with a width of approximately 0.15 µm and a height of approximately 0.4 µm. The semiconductor layer 104 may be formed, for example, by masking a portion of the prior topmost surface of the substrate 102 and etching away material from the topmost surface that is not covered by the mask, leaving the masked semiconductor layer 104 protruding from, but as an integral portion of, the substrate 102. Alternatively, the semiconductor layer 104 may be formed (e.g., grown) as a separate layer above the upper planar surface 102UPS. Additional details and examples may be found in U.S. patent application Ser. No. 16/920,903, filed Jul. 6, 2020, and entitled "FIN FIELD EFFECT TRANSISTOR WITH FIELD PLATING" which is hereby incorporated herein by reference. In either event, once the semiconductor layer 104 is formed, it is partitioned (e.g., selectively masked) to include different regions, namely, a source region 106, a body region 108, and a drain region 110, where portions or all of each region can be doped (by diffusion or implantation) to facilitate the desired electrical operation of the respective region. In an example of an NPN transistor formation, the source region 106 and the drain region 110 are doped with n-type dopants, and the body region 108 is doped with p-type dopants (and vice versa for a PNP transistor). Also in an example embodiment, LDMOS technology is included, so that a drift region 112 is located between the drain region 110 and the body region 108. In an example embodiment, the drift region 112 is the same conductivity type (e.g., n-type) as the drain region 110, while the drift region 112 effectively lengthens the conductive path of the drain region 110 relative to the body region 108, as compared to the width of the source region 106. A longer drain conductive path may be desired, for example, in a high voltage application, so as to buffer the electric field along the channel (the conductive path in the body region 108). Additionally, the semiconductor layer 104 includes a backgate (BG) region 114, adjacent and typically electrically connected to, the source region 106, as further detailed below. In the example of an NPN transistor, the BG region 114 is doped with p-type dopants.

Figure 1B:
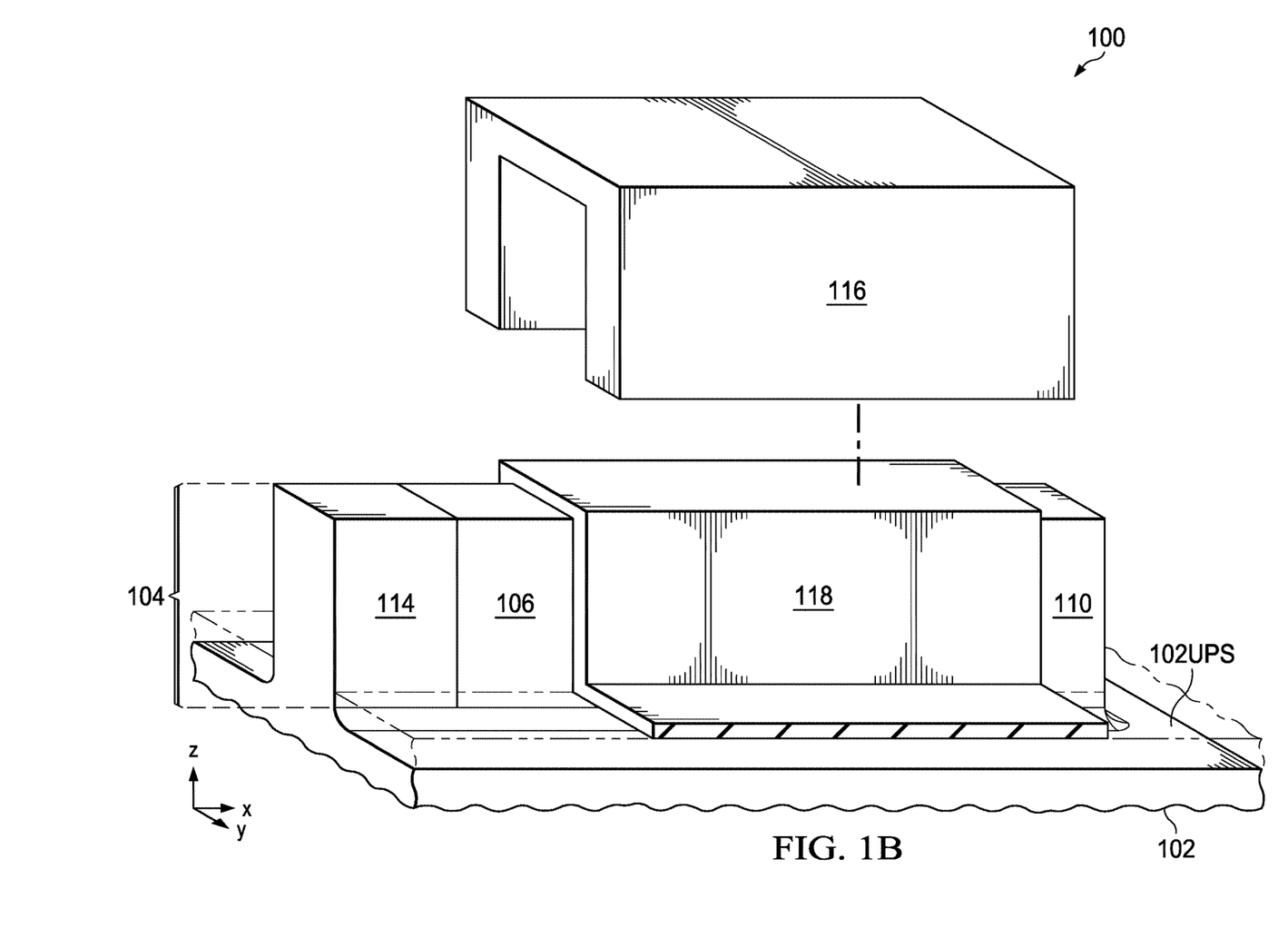
FIG. 1B is the FIG. 1A illustration with the additional of a gate oxide.
Figure 1C:
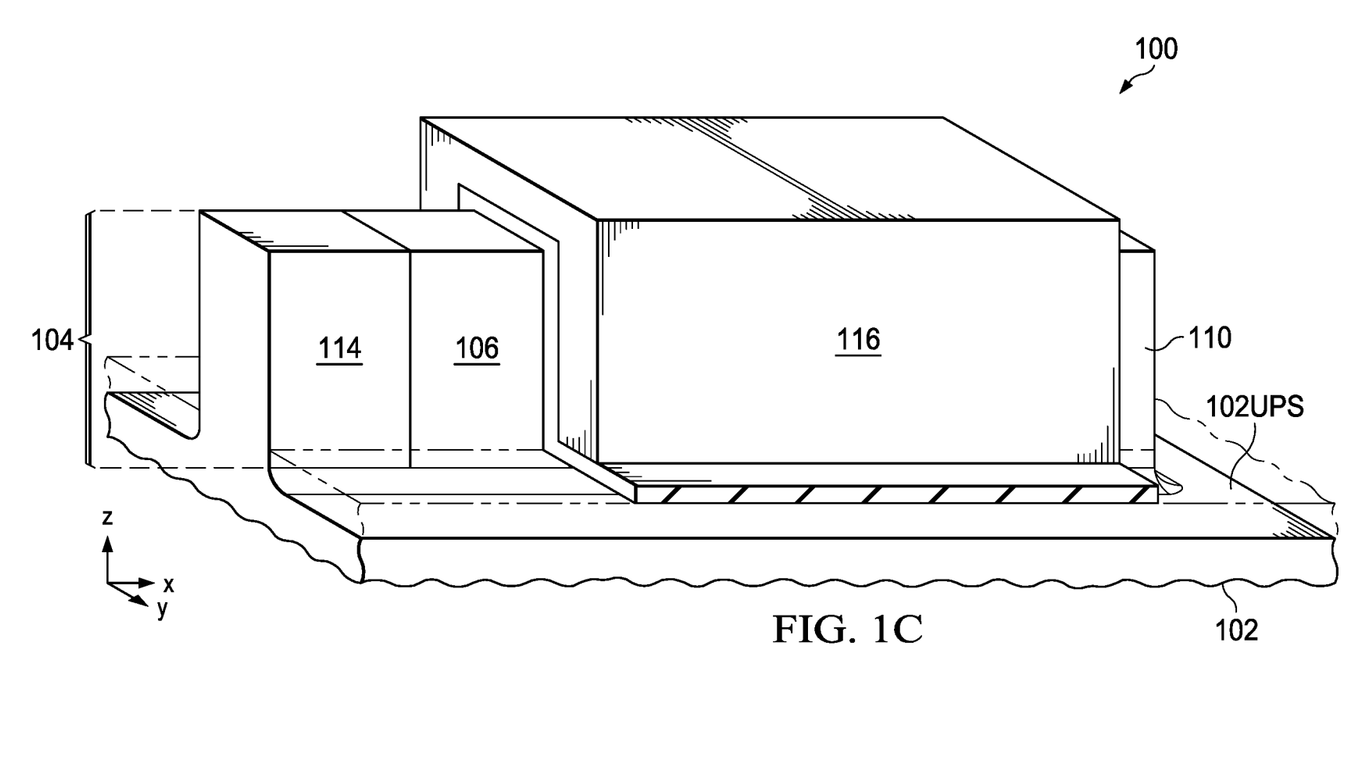
FIG. 1C is the FIG. 1B illustration with the gate positioned adjacent the gate oxide.

The finFET 100 also includes a gate 116, shown in exploded view above the remaining FIG. 1A structure, and also shown in FIGS. 1B and 1C. Particularly, FIG. 1B illustrates that before the gate 116 is formed, a gate oxide 118 is formed over portions of the semiconductor layer 104, for example fully overlapping the body region 108, a portion (or all) of the drift region 112, and a portion of the source region 106. Thereafter, FIG. 1C illustrates that the gate 116 is formed to align with, although separated from by the gate oxide 118, portions of the source region 106, the body region 108, and the drift region 112. The gate 116 is made to be conductive, for example by forming it with doped polysilicon, or it may be metal, also for example as preceded by a sacrificial polysilicon layer and subsequent metalization. With the gate 116 positioning and conductivity, an electrical signal to the gate 116 can control signal flow between the source region 106 and the drain region 110 (and the drift region 112), through a channel in the body region 108. Further, because the gate 116 extends generally in all three dimensions shown as x, y, and z, then unlike a traditional MOSFET in which the channel is in a single plane, in the finFET 100 the electrical influence is three-dimensional, forming a channel near or along each of three generally planar surfaces of the body region 108, shown in FIG. 1A as a top surface 108TS (in an x-y plane) and sidewalls 108SW (in the x-z plane).

Figure 1D:
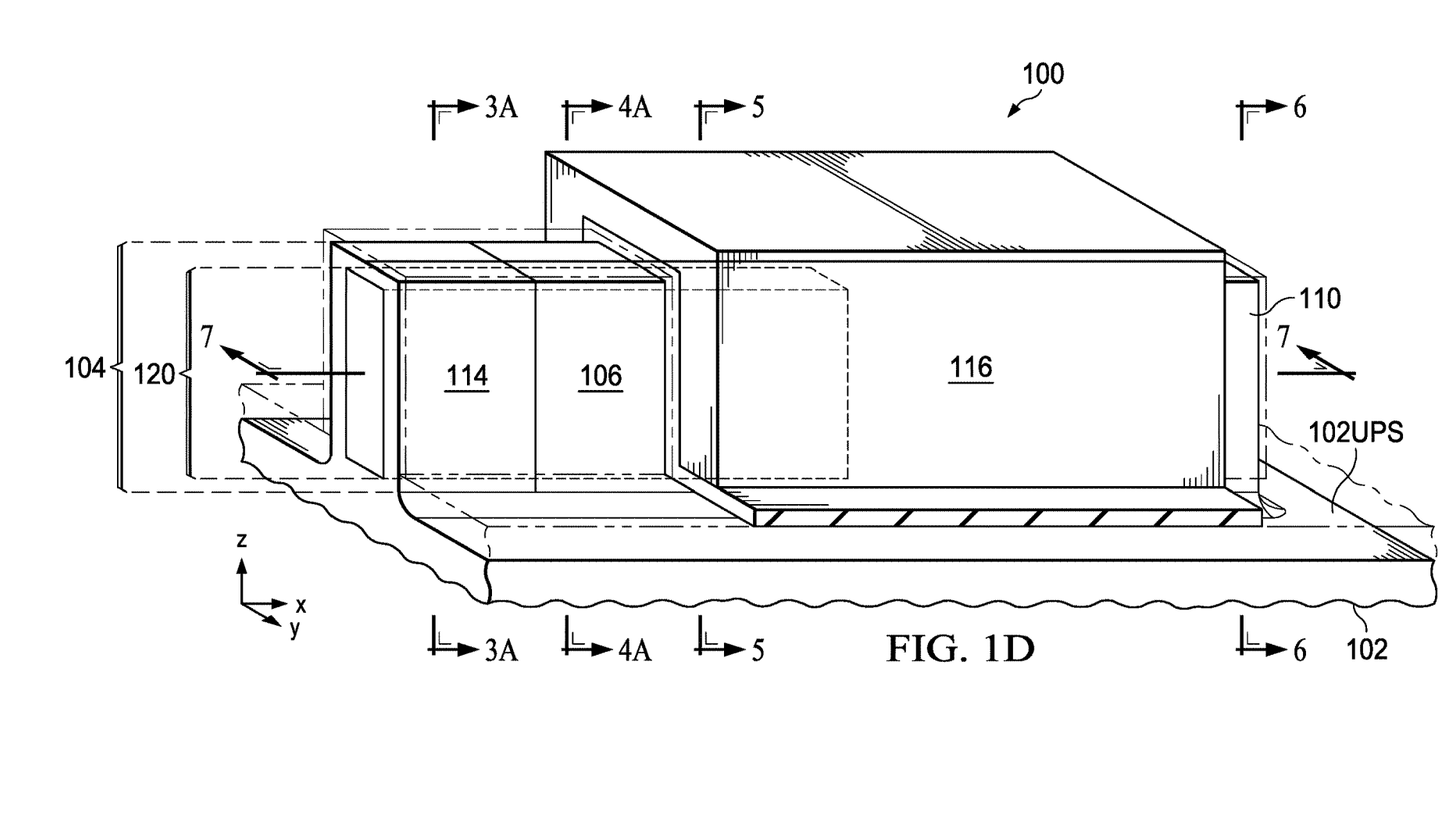
FIG. 1D is a perspective view of the FIGS. 1A-1C finFET, additionally illustrating a conductive core within the finFET backgate, source, and body.

FIG. 1D is a perspective view of the finFET 100 of FIGS. 1A-1C, illustrating a conductive core 120 within an interior area of the semiconductor layer 104. In an example embodiment, the conductive core 120 is formed by positioning (e.g., implanting) conductive dopants at a distance away from the top surface and sidewalls of selected portions of certain regions in the semiconductor layer 104. For example, the conductive core 120 may pass along the major axis, and within an interior, of the semiconductor layer 104, extending through an x-dimension portion or all of the BG region 114, the source region 106, and the body region 108. Because the BG region 114 is conductive, an electrical signal applied to it will couple to, and through, the conductive core 120. Accordingly, an electrical signal to the BG region 114 may continue, by the conductive core 120, through an inner (e.g., axial) portion of the source region 106 and the body region 108. Further, because the conductive core 120, or at least the most conductive portion of the conductive core 120 as explained later, does not extend to the outer sidewalls 106SW or top surface 106TS of the source region 106, then the semiconductor material portions of the source region 106 in which the conductive core 120 is not located may still function as a transistor source, for example as an n-type source. Similarly, because the conductive core 120 does not extend to the outer sidewalls 108SW or top surface 108TS of the body region 108, then the semiconductor material portions of the body region 108 in which the conductive core 120 is not located may still provide material in which may be induced a transistor channel, for example inducing a conductive channel in a p-type material. With the conductive core 120 axially within the body region 108, however, a bias signal on the conductive core 120 can serve to adjust backgate operational characteristics of the transistor channel, thereby essentially serving to electrically extend the physical BG region 114 to an area proximate the channel of the body region 108.

Figure 2A:
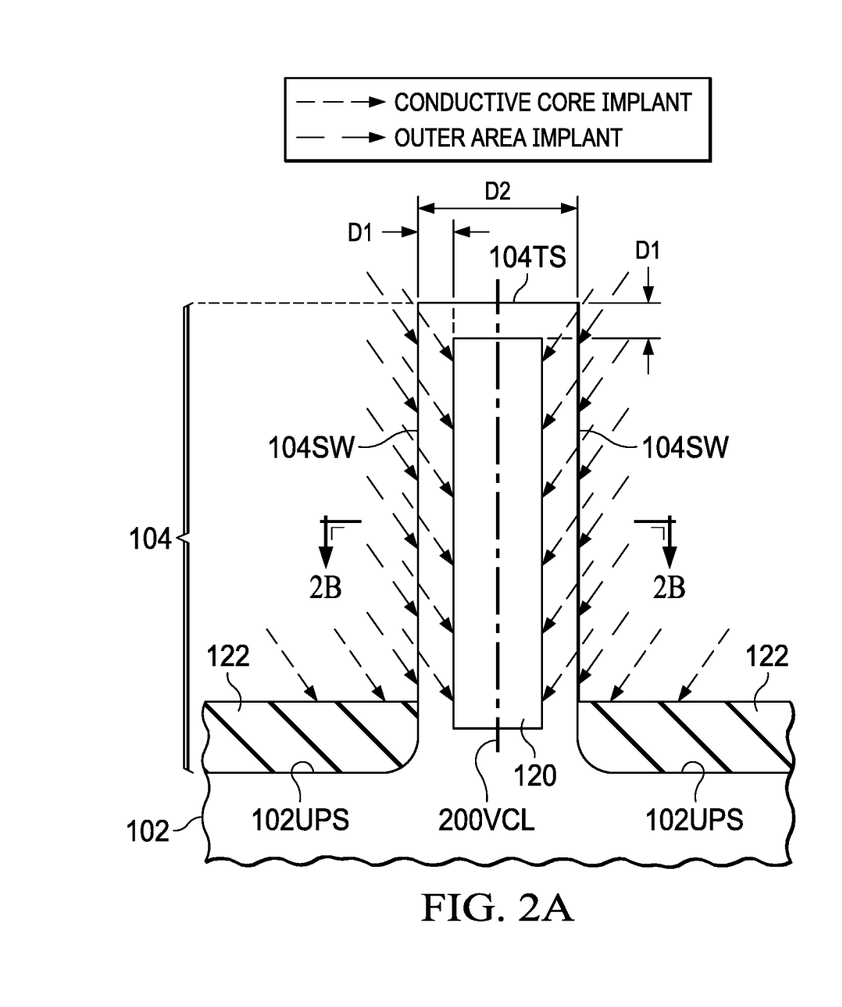
FIG. 2A is a partial cross-sectional diagram illustrative of a perpendicular view across the major axis of the FIG. 1A structure.

FIG. 2A is a cross-sectional diagram representing a partial perpendicular view across the FIG. 1A major axis of the semiconductor layer 104, and demonstrating doping steps directed to full doping in the body region 108, or a portion of the doping in the source region 106 and the BG region 114. While not shown in earlier figures, an implant block 122, such as a shallow trench insulator (STI), is formed near the bottom of the semiconductor layer 104 where it interfaces with the upper planar surface 102UPS. Thereafter, at least two different implant types are performed, one to primarily form the conductive core 120 in an interior (e.g., axial) portion of the semiconductor layer 104 and another to form an appropriate semiconductor path closer to the top surface or sidewalls of the semiconductor layer 104, based on the location, along the major axis of the semiconductor layer 104, being doped. For example, and as shown by the FIG. 2A legend, a first conductive core implant (or plasma doping), for example at angles relative to the FIG. 2A vertical orientation, is applied to the top surface 104TS and the sidewalls 104SW of the semiconductor layer 104, with conductive dopants of a same conductivity type as the body region 108 (e.g., p-type, as may be implemented with boron) and with a high concentration (p+) to facilitate a low resistance conductive path, that is, to form the conductive core 120. The implant is achieved with appropriate parameters (e.g., relatively high energy to achieve a dopant density in a range from $2e18/cm^3$ to $3e18/cm^3$, or possibly up to $5e18/cm^3$, depending on the fin size) so that the conductive core 120 is formed beyond a distance D1 from the outer surfaces of the semiconductor layer 104, where for example 200 Å≤D1≤400 Å, while the total width D2 of the semiconductor layer 104 (the fin) is 1,500 Å. Further, the conductive core 120 is only formed along a portion of the entire length of the semiconductor layer 104, where for example the FIG. 1D perspective view (and the FIG. 6 cross section) illustrates the conductive core 120 stopping at the interface between the body region 108 and the drift region 112. To achieve this termination, the drift region 112 and drain region 110 may be masked during the conductive core 120 implant. Also in the example, a second and outer area implant, again for example at angles relative to the FIG. 2A vertical orientation, but with a lower energy than the conductive core 120 implant, is applied to the top surface 104TS and the sidewalls 104SW of the semiconductor layer 104. The second implant, for example for the body region 108, is achieved with appropriate parameters (e.g., relatively low energy to achieve a lower density in a range from $2e17/cm^3$ to $3e17/cm^3$), typically determined to achieve a desired threshold voltage for the finFET 100, with the impact of this second implant primarily within the distance D1 from the outer surfaces of the semiconductor layer 104. Lastly, as further detailed later, additional outer area implants may be performed to achieve the desired function and dopants appropriate to complete the BG region 114 and the source region 106. For each of the preceding three examples, the doping parameters are such that the dopants stay generally or primarily within the distance D1 of the top surface and sidewalls and, accordingly, so the dopants do not affect the deeper cross-sectional area where a majority of the conductive core 120 is positioned. In alternative example embodiments, the formation of the conductive core 120 can be either before or after the doping of the source region 106 and the BG region 114. In general, however, the conductive core 120 (high energy) implant will be done first, so it would not be blocked by surface doping and would not knock in the surface doping, as might occur if the source region 106 and/or BG region 114 doping steps were first performed. Additionally, the drift region 112 and the drain region 110 also may be doped concurrently, or at a different time, as the appropriate dopant application of the second outer area implant (e.g., n-type for an NPN transistor, for example concurrently with the doping of the source region 106).

Figure 2B:
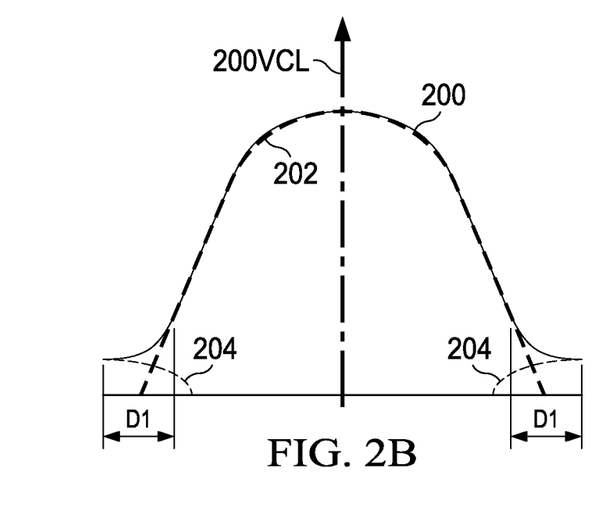
FIG. 2B is a doping concentration plot along the line 2B-2B in FIG. 2A.

FIG. 2B illustrates a doping concentration plot 200 as an additional representation of the conductive core 120, depicting dopant concentration along the line 2B-2B in FIG. 2A, and more particularly with respect to the full doping in the body region 108, or the partial doping in either the BG region 114 or the source region 106, with additional details as to these latter two regions described later. The FIG. 2B vertical axis depicts dopant concentration, and the FIG. 2B horizontal axis depicts length in both directions away from a vertical center line 200VCL, with the vertical center line 200VCL also shown in FIG. 2A. Further, the doping concentration plot 200 represents a total (sum) of both the first and second implants described above relative to FIG. 2A, so that the plot 200 results from a first plot 202 representing the first implant primarily forming the conductive core 120 and a second plot 204 representing the second implant adjusting dopant concentration within the distance D1 from the outer surfaces of the semiconductor layer 104. From FIG. 2B, the doping process and resultant formation of the conductive core 120 will provide a much higher dopant concentration near the center of the conductive core 120, with the concentration falling off with distance away from that center (away from the vertical center line 200VCL). In an example embodiment, the doping concentration closest to the vertical center line 200VCL is as high as possible to facilitate in that area a low resistance (and high conductive) path through the conductive core 120, but not too high so as to interfere with channel doping closer to the top surface 104TS or sidewalls 104SW. Further, however, some lower dopant concentration also will also exist within the D1 distance closest to the semiconductor layer top surface 104TS and sidewalls 104SW. For example, the dopant concentration, from the conductive core dopants, in the outermost D1 of the semiconductor layer 104 may be 20% or less of the highest concentration of those dopants at the centerline 200VCL. This lower dopant concentration can be adjusted to correspondingly adjust the channel threshold voltage. Accordingly, while FIG. 2A (and others) illustrates the shape of the conductive core 120 as rectangular, FIG. 2B illustrates that the practical engineered doping profile is more likely to have less of a clear boundary and to provide a bell shape, with the greatest dopant concentration at the vertical center line 200VCL and a lower concentration (e.g., 20% or less of the highest concentration at the vertical center line 200VCL) within D1 of the top surface 104TS and the sidewalls 104SW of the semiconductor layer 104.

Figure 3A:
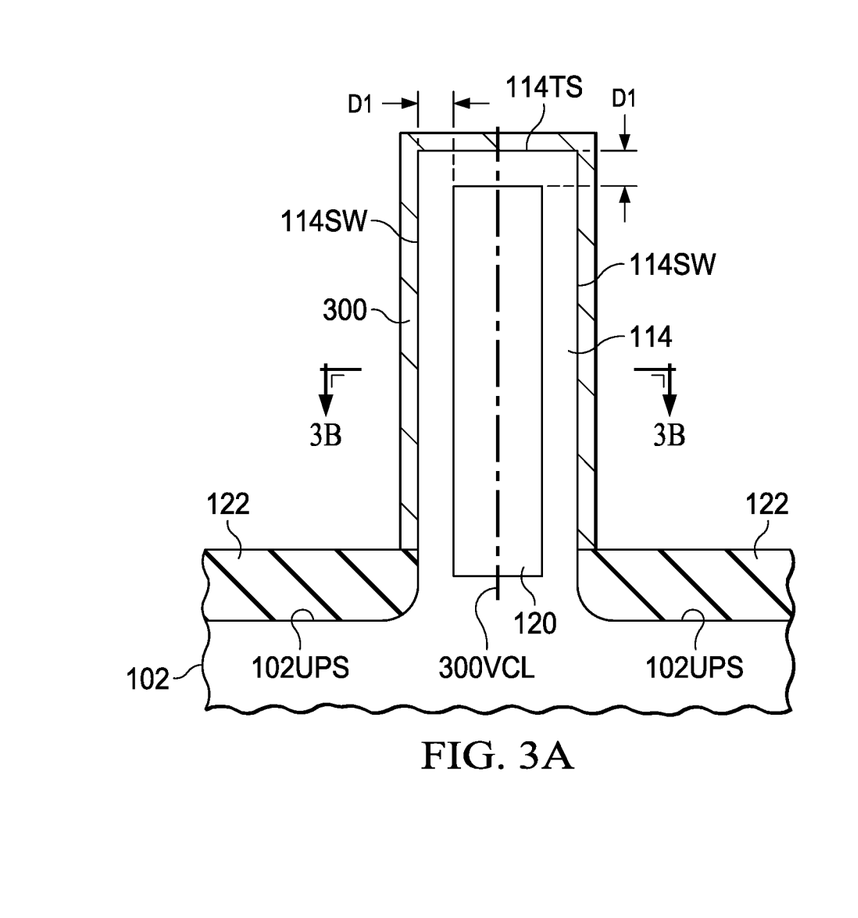
FIG. 3A is a cross-sectional diagram representing a perpendicular view along line 3-3 in FIG. 1D.

FIG. 3A is a cross-sectional diagram representing a perpendicular view across the major axis of the semiconductor layer 104 and along line 3-3 in FIG. 1D, that is, across the BG region 114. Accordingly, the conductive core 120, or at least the majority (over 50%) of its highest concentration of its conductive dopant profile, is positioned axially (into the page) and at a distance D1 or farther away from the BG top surface 114TS and the sidewalls 114SW, that is, closer to a vertical center line 300VCL. While not shown in FIG. 1D, FIG. 3A adds that a conductive layer 300 is formed along the outer surface of the BG region 114, for example as a silicide layer. Accordingly, an electrical signal contacting the conductive layer 300 also couples to the BG region 114, as well as to the interior-located portion of the conductive core 120. From the conductive core 120, that electrical signal may further pass along other portions (beyond the BG region 114) of the major axis of the semiconductor layer 104.

Figure 3B:
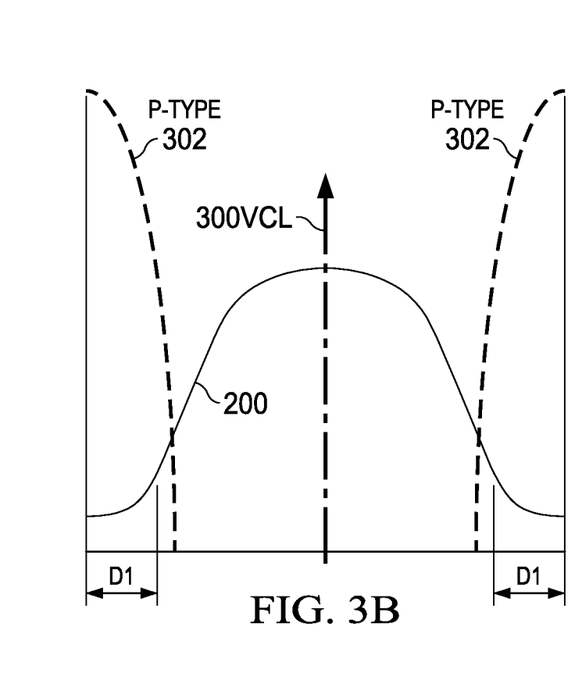

FIG. 3B illustrates an additional doping concentration plot 302, representing a portion of the total doping profile in the FIG. 3A cross-section, that is, across the BG region 114. In FIG. 3B, again the vertical axis depicts dopant concentration and the horizontal axis depicts length in both directions away from the vertical center line 300VCL, akin to the FIG. 2A vertical center line 200VCL but here with respect to the BG region 114. The FIG. 3B doping concentration necessarily includes the FIG. 2B plot 200, as the same implants described relative to FIG. 2B and the body region 108 are also formed applied to the BG region 114. Additionally, the semiconductor layer 104 may be masked with an opening to the area of the BG region 114, and then a p-type doping (e.g., boron) is applied to achieve a relatively high p+ doping concentration, again closer to the top surface and sidewalls (e.g., within the distance D1) of the unmasked portion of the semiconductor layer 104. Accordingly, the BG region 114 includes dopant concentrations represented by both the plot 200 and the plot 302. The plot 302 represents the additional p-type implant, for example to achieve a dopant density in a range from $3e20/cm^3$ to $6e20/cm^3$.

Figure 4A:
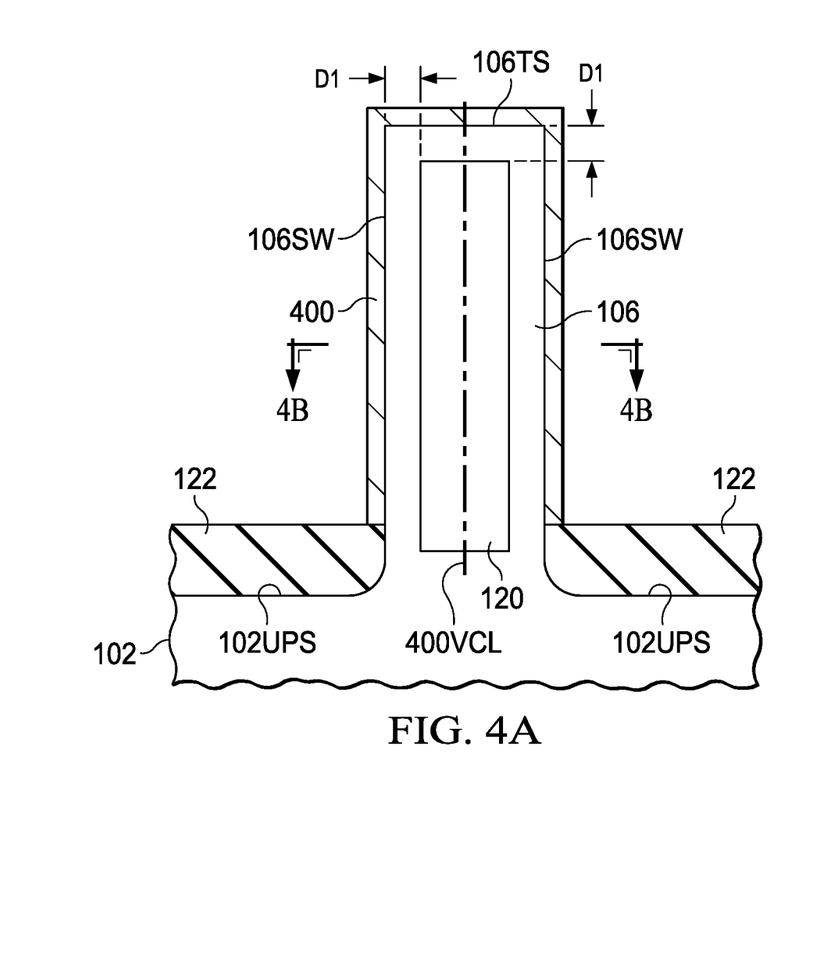
FIG. 4A is a cross-sectional diagram representing a perpendicular view along line 4-4 in FIG. 1D.

FIG. 4A is a cross-sectional diagram representing a perpendicular view across the major axis of the semiconductor layer 104 and along line 4-4 in FIG. 1D, that is, across the source region 106. The conductive core 120 is positioned axially (into the page) and at a distance D1 within and away from the source top surface 106TS and the sidewalls 106SW. While not shown in FIG. 1D, FIG. 4A adds that a conductive layer 400 is formed along the outer surface of the source region 106, for example as a silicide layer. Accordingly, an electrical signal contacting the conductive layer 400 also couples to the source region 106, which sometimes is coupled to the BG region 114, for example by having the conductive layer 400 as the same layer as the FIG. 3 conductive layer 300. Also from FIG. 4A, the conductive core 120 continues from the same conductive core 120 shown in FIG. 3A, so that an electrical signal from the BG region 114, to the FIG. 3A interior-positioned conductive core 120, passes also to the FIG. 4A interior-positioned conductive core 120.

Figure 4B:
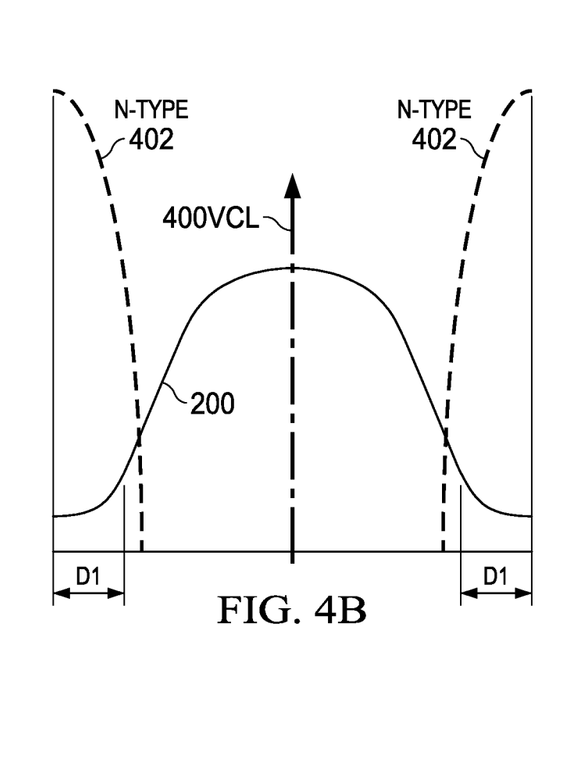
FIG. 4B illustrates a doping concentration plot representing a portion of the total doping profile in the FIG. 4A cross-section.

FIG. 4B illustrates an additional doping concentration plot 402, representing a portion of the total doping profile in the FIG. 4A cross-section, that is, across the source region 106. In FIG. 4B, once more the vertical axis depicts dopant concentration and the horizontal axis depicts length in both directions away from a vertical center line 400VCL, akin to the FIG. 2A vertical center line 200VCL but here with respect to the source region 106. The FIG. 4B doping concentration necessarily includes the FIG. 2B plot 200, as the same implants described relative to FIG. 2B and the body region 108 are also formed applied to the source region 106. Additionally, the semiconductor layer 104 may be masked with an opening to the area of the source region 106, and then an n-type doping (e.g., arsenic, phosphorous, or a combination of both) is applied to achieve a relatively high n+ doping concentration, again closer to the top surface and sidewalls (e.g., within the distance D1) of the unmasked portion of the semiconductor layer 104. Accordingly, the source region 106 includes dopant concentrations represented by both the plot 200 and the plot 402. The plot 402 represents the additional n-type implant, for example to achieve a dopant density in a range from $5e20/cm^3$ to $1e21/cm^3$.

Figure 5:
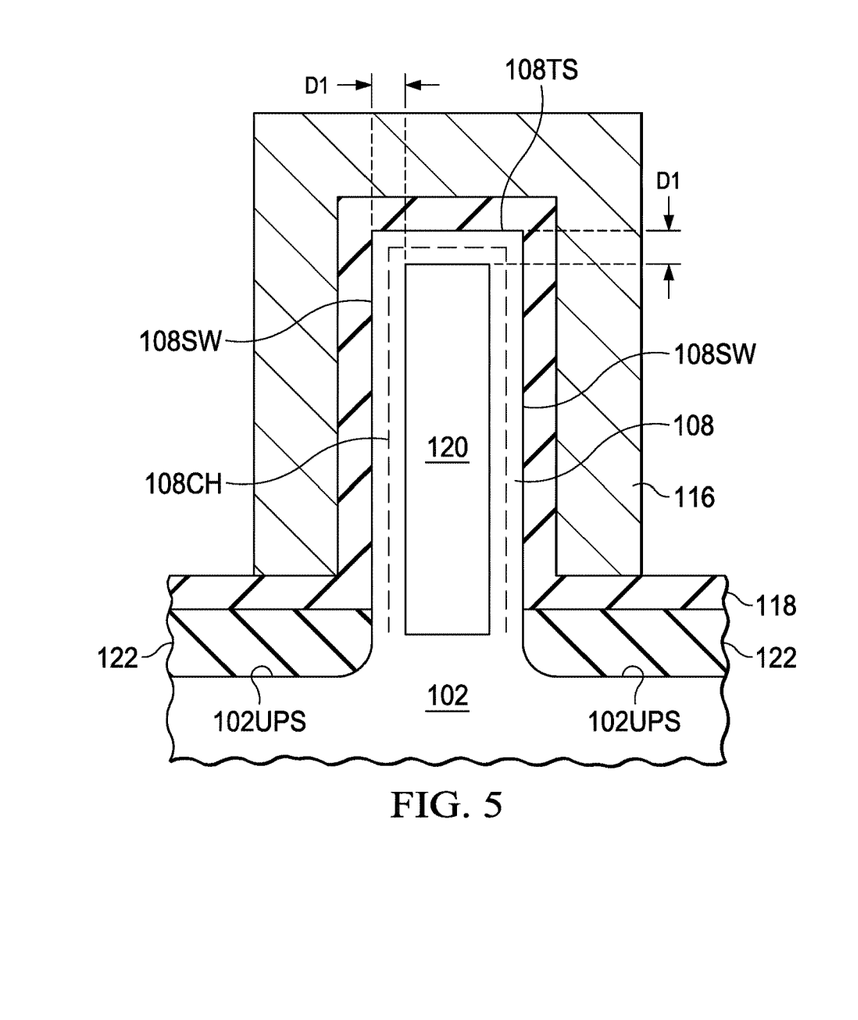
FIG. 5 is a cross-sectional diagram representing a perpendicular view along line 5-5 in FIG. 1D.

FIG. 5 is a cross-sectional diagram representing a perpendicular view across the major axis of the semiconductor layer 104 and along line 5-5 in FIG. 1D, that is, across the body region 108, and as described above, with FIG. 2B illustrating the dopant profile therein. The conductive core 120 is positioned axially (into the page) and at a distance D1 within and away from the source top surface 108TS and the sidewalls 108SW. FIG. 5 further illustrates the gate oxide 118 formed along the outer surface of the body region 108 (along the sidewalls 108SW and the top surface 108TS), and the gate 116 formed along the outer surface of the gate oxide 118. Electrical contact may then be made to the gate 116, which induces an electrical channel 108CH (shown generally as a dashed/dotted line) in the D1 thick semiconductor material of the body region 108 near the top surface 108TS and the sidewalls 108SW. In contrast, at a distance D1 and greater away from the top surface 108TS and the sidewalls 108SW, the conductive core 120 continues from the same conductive core 120 shown in FIGS. 3A and 4A, so that an electrical signal from the BG region 114, to the FIG. 3A interior-positioned conductive core 120 and passed to the FIG. 4A interior-positioned conductive core 120, also passes to the FIG. 5 interior-positioned conductive core 120. Accordingly, the electrical signal in the FIG. 5 interior-positioned conductive core 120 may provide backgate electrical influence to the channel formed in the D1 thick semiconductor material of the body region 108.

Figure 6:
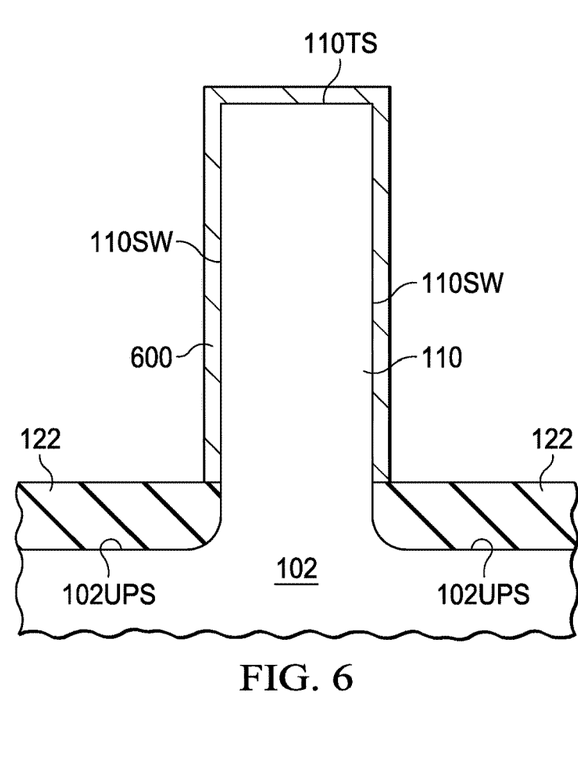
FIG. 6 is a cross-sectional diagram representing a perpendicular view along line 6-6 in FIG. 1D.

FIG. 6 is a cross-sectional diagram representing a perpendicular view across the major axis of the semiconductor layer 104 and along line 6-6 in FIG. 1D, that is, across the drain region 110 (or as would be comparable across the drift region 112). As described earlier, the conductive core 120 (FIG. 1D) does not extend to the drain region 110, so the conductive core 120 is not shown in FIG. 6. Instead, the drain region 110 includes n-type dopants, for example which may be formed with dopant density in a range from $2e16/cm^3$ to $5e17/cm^3$. FIG. 6 further illustrates a conductive layer 600 formed along the outer surface, that is along sidewalls 110SW and a top surface 110TS, of the drain region 110, for example as a silicide layer. Electrical contact may then be made to the drain region 110, by contacting the conductive layer 600.

Figure 7:
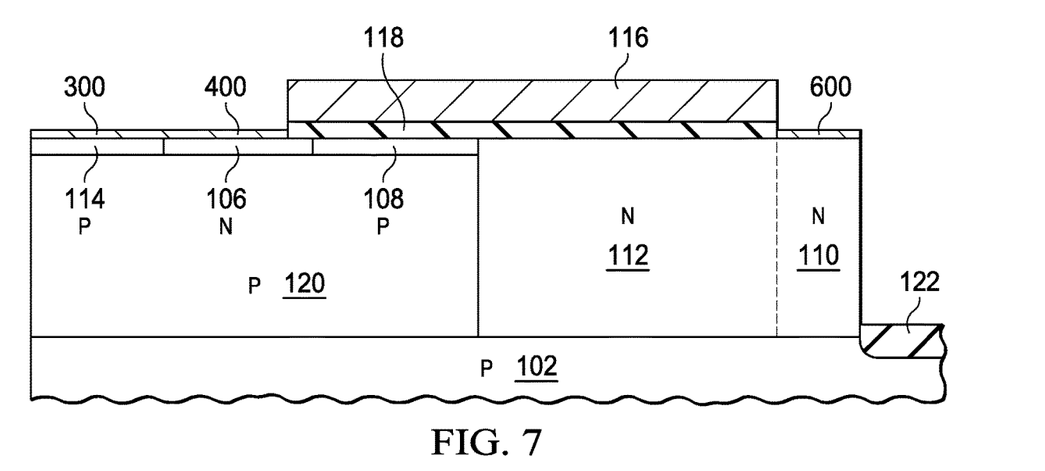
FIG. 7 is a cross-sectional diagram representing a view along line 7-7 in FIG. 1D.

FIG. 7 is a cross-sectional diagram representing a view along the major axis of the semiconductor layer 104 and along line 7-7 in FIG. 1D, along with the conductive layers 300 and 400 from FIGS. 3A and 4A, respectively (and a comparable conductive layer 700 along the top surface of the drain region 110). The FIG. 7 perspective thereby depicts that the example NPN structure is provided between the source region 106, the body region 108, and the drift region 112 and the drain region 110, while the conductive core 120 extends along the length of the BG region 114, the source region 106, and the body region 108, thereby providing the earlier-described conductive path to influence the channel 108CH (FIG. 5) in the outer D1 thickness of the body region 108. FIG. 7 also illustrates the example where an end of the conductive core 120 aligns with the interface between the body region 108 and the drift region 112.

Figure 8:
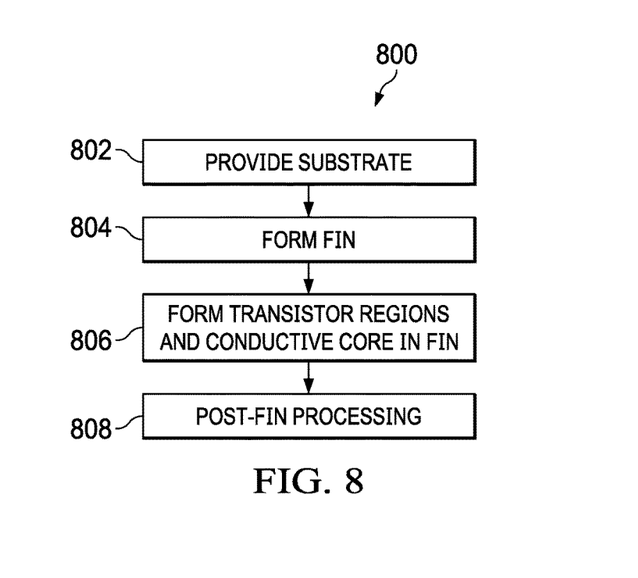
FIG. 8 is a flow diagram of an example embodiment method for forming a finFET.

FIG. 8 is a flow diagram of an example embodiment method 800 for forming a finFET. The method 800 begins in a step 802, in which the FIG. 1A semiconductor substrate 102 is obtained. The semiconductor substrate may be a portion of a semiconductor wafer which, at this stage, will have incurred some earlier processing steps. Such processing steps may include, for example, wafer cleaning (e.g., chemical and/or mechanical), isolation, and possible formation of structures or regions below the upper planar surface 102UPS. Next, the method 800 continues from the step 802 to a step 804.

In the step 804, a fin structure is formed, for example in the form of the FIG. 1A semiconductor layer 104. The semiconductor layer 104 may be formed, for example, by etching away areas from an initial surface of the wafer and down to what is shown in FIG. 1A as the upper planar surface 102UPS, thereby leaving a remaining portion of the wafer in the form of the semiconductor layer 104 protruding away the upper planar surface 102UPS. Alternatively, the semiconductor layer 104 may be deposited as an additional layer, affixed to and protruding away the upper planar surface 102UPS. Additionally, the fin may have various shapes or multiple fins may be formed; the example of FIGS. 1A-1D illustrates a generally longitudinal structure, but alternative embodiments may be formed with portions extending in angles (e.g., perpendicularly) relative an otherwise to longitudinal structure. Next, the method 800 continues from the step 804 to a step 806.

In the step 806, masking and doping are applied to the fin structure, to form, separately in an example, transistor regions in one doping operation or operations, and a conductive core in another operation, where the conductive core is formed with its highest dopant concentration internally within a structure that provides and operates as a transistor source or body region nearer one or more of its surfaces. FIGS. 2A-5 illustrate an example of such a conductive core 120, in which the highest of its dopant concentration is formed at a distance D1 or more away from the top surface and sidewalls of the fin (the semiconductor layer 104). In contrast, the outermost D1 width within the surface of the fin semiconductor material is doped to serve as the transistor source region 106 and the body region 108 (including the channel). Accordingly, the fin semiconductor material farther internal, beyond D1, provides a conductive core 120 operable to communicate a backgate bias adjacent the transistor channel (within the body region 108). Next, the method 800 continues from the step 806 to a step 808.

In the step 808 and following, post-fin formation processes are performed, so as to complete any circuit features, connections, and the like for ICs of the semiconductor wafer. In this regard, silicides (e.g., FIG. 7, conductive layers 300, 400, 700) may be formed, as may additional layers and/or other devices for each IC on the wafer. Thereafter, each IC formed on the wafer can be separated from the wafer, packaged, tested, and ultimately if satisfactory, approved for distribution, such as by sale and delivery to a customer.

From the above, one skilled in the art should appreciate that example embodiments are provided for semiconductor fabrication and devices, for example with respect to a finFET, including an LDMOS finFET, with an improved backgate coupling. Such embodiments provide various benefits, some of which are described above and including still others. For example, benefits can include those provided in general by finFET devices, and further include a low resistance backgate coupling, for example also extending to the transistor channel Another benefit is an improved SOA. Still other benefits are the flexibility of variations for different example embodiments, in that, for example, fin shapes and layer dimensions may vary, and layer position, while shown as directly contacting in various example embodiments, may be separated in some instances by additional materials. As a final example, additional modifications are possible in the described embodiments, and other embodiments are possible, within the scope of the following claims.

What is claimed is:

1. An integrated circuit, comprising:
    a substrate with a fin extending from a surface of the substrate, the fin including:
        a source region;
        a drain region;
        a body region; and
        the source region including:
            an outer region having a first conductivity type complementary to a second conductivity type of an outer region of the body region; and
            an interior-positioned conductive region having the second conductivity type.

2. The integrated circuit of claim 1:
    wherein the interior-positioned conductive region includes a first dopant concentration of the second conductivity type; and
    wherein the outer region of the source region includes a second dopant concentration of the second conductivity type, wherein the second dopant concentration is less than the first dopant concentration.

3. The integrated circuit of claim 2 wherein the second dopant concentration is 20% or less than the first dopant concentration.

4. The integrated circuit of claim 1 wherein the first conductivity type includes n-type and the second conductivity type includes p-type.

5. The integrated circuit of claim 1 wherein the first conductivity type includes p-type and the second conductivity type includes n-type.

6. The integrated circuit of claim 1:
    wherein the source region is adjacent the body region; and
    wherein the fin further includes a drift region between the body region and the drain region.

7. The integrated circuit of claim 1 and further including:
    a gate oxide adjacent the body region; and
    a gate adjacent the gate oxide.

8. The integrated circuit of claim 1 wherein the body region includes sidewalls and a surface between the sidewalls, and further including:
    a gate oxide adjacent the sidewalls and the surface of the body region; and
    a gate adjacent the gate oxide.

9. The integrated circuit of claim 1 wherein the fin further includes a backgate region adjacent the source region, the backgate region having the second conductivity type.

10. The integrated circuit of claim 9 wherein the backgate region is electrically coupled to the interior-positioned conductive region.

11. The integrated circuit of claim 9 wherein at least a portion of the backgate region also includes the interior-positioned conductive region.

12. The integrated circuit of claim 1 wherein at least a portion of the body region also includes the interior-positioned conductive region.

13. A method of forming an integrated circuit, the method comprising:
    forming a fin extending from a surface of a substrate;
    forming a drain region in the fin;
    forming a body region in the fin; and
    forming a source region in the fin, including:
        forming an outer region having a first conductivity type complementary to a second conductivity type of an outer region of the body region; and
        forming an interior-positioned conductive region having the second conductivity type.

14. The method of claim 13:
    wherein the interior-positioned conductive region includes a first dopant concentration of the second conductivity type; and
    wherein the outer region of the source region also includes a second dopant concentration of the second conductivity type, wherein the second dopant concentration is less than the first dopant concentration.

15. The method of claim 14 wherein the second dopant concentration is 20% or less than the first dopant concentration.

16. The method of claim 13:
    wherein the source region is adjacent the body region; and
    further including forming a drift region between the body region and the drain region.

17. The method of claim 13 wherein the body region includes sidewalls and a surface between the sidewalls, and further including:
    forming a gate oxide adjacent the sidewalls and the surface of the body region; and
    forming a gate adjacent the gate oxide.

18. An integrated circuit, comprising:
    a substrate with a fin extending from a surface of the substrate, the fin having a top side, a first sidewall and a second sidewall opposing the first sidewall;
    a source in a source region of the fin, the source extending along an outer region of the fin along the top side, the first sidewall and the second sidewall;
    a drain in a drain region of the fin;
    a body in a body region of the fin; and
    a conductive core in an interior region of the fin, wherein the conductive core extends in the interior region of the fin from the source region into the body region and terminates without reaching the drain region.

19. The integrated circuit of claim 18, further comprising a backgate in a backgate region on an opposite side of the source from the body in the fin, the backgate extending along the outer region of the fin along the top side, the first sidewall and the second sidewall.

20. The integrated circuit of claim 19, wherein the conductive core has a first concentration of a first conductivity type dopant, the body has a second concentration of the first conductivity type dopant and the backgate has a third concentration of the first conductivity type dopant, wherein the first concentration is greater than the second concentration and the third concentration is greater than the first concentration.

21. The integrated circuit of claim 9 and further including:
a first conductive layer adjacent to the backgate region; and
a second conductive layer adjacent to the source region, wherein the first conductive layer is connected to the second conductive layer.

22. The integrated circuit of claim 21 wherein the first and second conductive layers include a silicide layer.

23. The integrated circuit of claim 9 wherein a peak dopant concentration in an outer region of the backgate region is greater than a peak dopant concentration of the interior-positioned conductive region.

24. The integrated circuit of claim 1 and further including:
a first conductive layer adjacent to the source region; and
a second conductive layer adjacent to the drain region.

25. The integrated circuit of claim 24 wherein the first and second conductive layers include a silicide layer.

26. The integrated circuit of claim 1 wherein a peak dopant concentration in the outer region of the source region is greater than a peak concentration of the interior-positioned conductive region.

27. The integrated circuit of claim 1 wherein a peak dopant concentration in an outer region of the body region is less than a peak dopant concentration of the interior-positioned conductive region.

28. The integrated circuit of claim 6 wherein the drift region and the drain region includes a same conductivity type.

29. The integrated circuit of claim 18, wherein the body extends along the outer region of the fin along the top side, the first sidewall and the second sidewall.

30. The integrated circuit of claim 19, wherein the conductive core extends in the interior region from the backgate region into the body region.

31. The integrated circuit of claim 18, wherein:
the source region is adjacent the body region; and
the conductive core extends through the source region and into the body region.

32. The integrated circuit of claim 18, wherein:
the source region is adjacent the body region; and
the fin further includes a drift region between the body region and the drain region.

33. The integrated circuit of claim 32, wherein:
the conductive core extends through the source region and stops at an interface between the body region and the drift region.

34. The integrated circuit of claim 1, wherein:
the source region is adjacent the body region; and
the interior-positioned conductive region extends through the source region and into the body region.

35. The integrated circuit of claim 1, wherein:
the source region is adjacent the body region; and
the fin further includes a drift region between the body region and the drain region.

36. The integrated circuit of claim 35, wherein:
the interior-positioned conductive region extends through the source region and stops at an interface between the body region and the drift region.

* * * * *